US012588331B2

(12) United States Patent
Mezouari

(10) Patent No.: US 12,588,331 B2
(45) Date of Patent: Mar. 24, 2026

(54) SELECTIVE OPTICAL FILTER FOR RGB LED

(71) Applicant: PLESSEY SEMICONDUCTORS LTD, Plymouth (GB)

(72) Inventor: Samir Mezouari, Plymouth (GB)

(73) Assignee: Plessey Semiconductors Ltd, Plymouth (GB)

( * ) Notice: Subject to any disclaimer, the term of this patent is extended or adjusted under 35 U.S.C. 154(b) by 433 days.

(21) Appl. No.: 18/019,692

(22) PCT Filed: Sep. 3, 2021

(86) PCT No.: PCT/GB2021/052279

§ 371 (c)(1),
(2) Date: Feb. 3, 2023

(87) PCT Pub. No.: WO2022/053786

PCT Pub. Date: Mar. 17, 2022

(65) Prior Publication Data

US 2023/0317892 A1 Oct. 5, 2023

(30) Foreign Application Priority Data

Sep. 10, 2020 (GB) ..................................... 2014266

(51) Int. Cl.
*H10H 20/851* (2025.01)
*H10H 20/01* (2025.01)
(Continued)

(52) U.S. Cl.
CPC .... *H10H 20/8514* (2025.01); *H10H 20/0137* (2025.01); *H10H 20/812* (2025.01); *H10H 20/814* (2025.01); *H10H 20/856* (2025.01)

(58) Field of Classification Search
CPC ........... H10H 20/8514; H10H 20/0137; H10H 20/812; H10H 20/814; H10H 20/856;
(Continued)

(56) References Cited

U.S. PATENT DOCUMENTS

| | | | |
|---|---|---|---|
| 4,666,250 A | 5/1987 | Southwell | |
| 9,018,655 B2 * | 4/2015 | Tu ........................ | H10H 20/852 |
| | | | 257/96 |

(Continued)

FOREIGN PATENT DOCUMENTS

| | | |
|---|---|---|
| CN | 108242483 A | 7/2018 |
| CN | 110190511 A | 8/2019 |

(Continued)

OTHER PUBLICATIONS

International Search Report and Written Opinion in PCT International Application No. PCT/GB2021/052279 mailed Dec. 8, 2021.
(Continued)

*Primary Examiner* — Mark W Tornow
(74) *Attorney, Agent, or Firm* — Cognition IP, P.C.; Edward Steakley

(57) ABSTRACT

A method of forming a light emitting structure, the light emitting structure comprising: a light emitting layer configured to emit light having a primary peak wavelength; a partially reflective layer; a reflective layer; and a colour conversion layer, wherein the light emitting layer is positioned at least partially between the partially reflective layer and the reflective layer and the colour conversion layer is positioned at least partially between the light emitting layer and the partially reflective layer, wherein the partially reflective layer is configured to reflect light within a predetermined range of wavelengths and transmit light outside the (Continued)

predetermined range of wavelengths and wherein the primary peak wavelength is within the predetermined range of wavelengths.

20 Claims, 5 Drawing Sheets

(51) Int. Cl.
| | | |
|---|---|---|
| *H10H 20/812* | (2025.01) | |
| *H10H 20/814* | (2025.01) | |
| *H10H 20/856* | (2025.01) | |

(58) Field of Classification Search
CPC .. H10H 20/882; H10H 20/841; H10H 20/062; H10H 29/10; H10H 20/01; H10H 20/018; H10H 20/82; H10H 20/825; H10H 20/851; H10H 20/8513; H10H 20/8515; H01L 25/0753
See application file for complete search history.

(56) References Cited

U.S. PATENT DOCUMENTS

| | | | |
|---|---|---|---|
| 2013/0087821 A1 | 4/2013 | Do et al. | |
| 2017/0077358 A1 * | 3/2017 | Chiu .................... | H10H 20/841 |
| 2018/0090645 A1 | 3/2018 | Nelson et al. | |
| 2018/0182931 A1 | 6/2018 | Lee et al. | |
| 2019/0189864 A1 * | 6/2019 | Ye ........................ | H10H 20/854 |
| 2019/0221730 A1 * | 7/2019 | Yoo ....................... | H10H 20/851 |

FOREIGN PATENT DOCUMENTS

| | | | |
|---|---|---|---|
| EP | 3546818 A1 | 10/2019 | |
| JP | 2007173844 A | 7/2007 | |
| JP | 2007258486 A | 10/2007 | |
| JP | 2015008329 A | 1/2015 | |
| JP | 2015076527 A | 4/2015 | |
| JP | 2015204300 A | 11/2015 | |
| TW | 202018765 A | 5/2020 | |
| TW | 202029534 A | 8/2020 | |
| WO | 2016098853 A1 | 6/2016 | |
| WO | 2019063957 A1 | 4/2019 | |

OTHER PUBLICATIONS

Yang, Xuaokun et al., "Large-area, liftoff nanoporous GaN distributed Bragg reflectors: Fabrication and application", Applied Surface Science, Elsevier, Amsterdam, ML., vol. 489, May 25, 2019, pp. 849-855.

International Preliminary Report on Patentability in PCT application No. PCT/GB2021/052279, mailed Mar. 23, 2023.

Office Action received in counterpart Japanese application No. 2023-515193, mailed on Jan. 6, 2026.

* cited by examiner

SELECTIVE OPTICAL FILTER FOR RGB LED

CROSS-REFERENCE TO RELATED APPLICATIONS

This application is a 35 U.S.C. § 371 national stage application of PCT International Application No. PCT/GB2021/052279, filed on Sep. 9, 2021, which claims the benefit of Great Britain Application No. 2017266.7 filed Sep. 10, 2020, which are hereby incorporated by reference in their entirety.

FIELD OF THE INVENTION

The invention relates to light emitting structures and methods of forming light emitting structures. In particular, but not exclusively, the invention relates to improved colour conversion in light emitting diode structures.

BACKGROUND

It is known that light emitting diode (LED) devices provide efficient sources of light for a wide range of applications. LED light sources are used to provide conventional white light, and/or multi-colour light emission. For example, multi-colour light emission includes red, green and/or blue emission suitable for display applications. The desired wavelengths of light provided for by LEDs are typically achieved using a combination of a pump source LED with colour conversion layer, such as a phosphor, quantum dots (QDs) or organic semiconductors, for example. Such pump source LEDs generate light with a primary peak wavelength output and stimulate emission of light of a different wavelength in a colour conversion layer. For example, blue light Nitride material LEDs (emitting light with a primary peak wavelength of approximately 450 nm) are used to provide white colour converted light LED emission. Blue Nitride material LEDs are also used to provide red colour converted light LED emission and green colour converted light LED emission.

However, whilst pump source LEDs, such as blue Nitride-based material LEDs, are available with high quality, efficient light emission, the application of colour conversion layers to achieve light of a desired colour typically results in colour converted LEDs with reduced efficiency in light emission compared with the source LEDs that are used to pump the colour conversion layer. Such reduced efficiency is due to, for example, absorption in the colour conversion layer of light generated by the source LEDs. Accordingly, a variety of optical coating methods have been used to reduce the losses due to the absorption of light in the colour conversion layer. However, such conventional optical coatings are expensive and difficult to implement in mass production.

Accordingly, it would be beneficial to enable more efficient light extraction in colour converted LEDs that use colour conversion techniques to provide light of desired wavelengths.

STATEMENTS OF INVENTION

In order to mitigate for at least some of the above-described problems, there is provided:

A method of forming a light emitting structure, the light emitting structure comprising: a light emitting layer configured to emit light having a primary peak wavelength; a partially reflective layer; a reflective layer; and a colour conversion layer, wherein the light emitting layer is positioned at least partially between the partially reflective layer and the reflective layer and the colour conversion layer is positioned at least partially between the light emitting layer and the partially reflective layer, wherein the partially reflective layer is configured to reflect light within a predetermined range of wavelengths and transmit light outside the predetermined range of wavelengths and wherein the primary peak wavelength is within the predetermined range of wavelengths.

Further, there is provided a light emitting structure comprising: a light emitting layer configured to emit light having a primary peak wavelength; a partially reflective layer; a reflective layer; and a colour conversion layer, wherein the light emitting layer is positioned at least partially between the partially reflective layer and the reflective layer and the colour conversion layer is positioned at least partially between the light emitting layer and the partially reflective layer, wherein the partially reflective layer is configured to reflect light within a predetermined range of wavelengths and transmit light outside the predetermined range of wavelengths and wherein the primary peak wavelength is within the predetermined range of wavelengths.

Advantageously, a light emitting structure formed in this way provides improved colour conversion efficiency, minimizes the amount of colour conversion material required and is suitable for mass manufacturing. Beneficially, the method is applicable to LEDs of different sizes, including micro-LEDs, capable of realising white LED, or multi-colour LED displays and is suitable for the mass transfer of individual LEDs, micro-LEDs, and/or monolithic LED arrays.

Preferably the colour conversion layer comprises first and second laterally spaced layers wherein the first layer is configured to convert incident light having the primary peak wavelength into light having a wavelength outside the predetermined range of wavelengths and the second layer is configured to transmit incident light having the primary peak wavelength, and wherein the partially reflective layer extends over the first layer of the colour conversion layer, but not the second layer.

Preferably the first layer of the colour conversion layer further comprises first and second laterally spaced sub-layers, wherein the first sub-layer is configured to convert incident light having the primary peak wavelength in to light having a first wavelength outside the predetermined range of wavelengths and the second sub-layer is configured to convert incident light having the primary peak wavelength in to light having a second wavelength outside the predetermined range of wavelengths Advantageously, this allows a portion of light having the primary wavelength to exit the light emitting structure by passing directly through the second layer of the colour conversion layer, whilst light converted to wavelengths outside of the predetermined range of wavelengths is emitted from the first layer of the colour converted layer and exits the light emitting structure via the partially reflective layer. Any light that passes through the first layer of the colour conversion layer without being converted is reflected by the partially reflecting layer back for re-use, thereby improving efficiency.

Preferably the partially reflective layer comprises a Distributed Bragg Reflector (DBR) wherein the DBR comprises porous GaN. Advantageously, a DBR is incorporated into the growth process, thereby enabling the formation of crystalline semiconductor layers that provide the required partial reflective functionality without compromising the crystalline quality required to form high quality, efficient light emitting diode devices.

Preferably the reflective layer comprises a Silver (Ag)-based mirror. Advantageously, a highly reflective layer is incorporated into the structure, thereby increasing the re-use of backscattered light and light that is not emitted by the colour conversion layer, but that propagates back through the structure, falling incident on the Ag-based mirror. Beneficially, Ag is used simultaneously to form the mirror layer and provide eutectic bonding to a handling device, thereby serving a dual purpose.

Preferably the method further comprises depositing the reflective layer on a light emitting device comprising the light emitting layer. Advantageously, light emitting devices, such as light emitting diode devices may be provided and known deposition techniques used to provide the reflective layer without compromising the quality of the light emitting device and whilst enabling at least visible and/or ultraviolet light to be reflected for colour conversion and/or emission.

Preferably the method further comprises growing a light emitting device comprising the light emitting layer on a substrate, followed by removing the substrate, preferably by wet etching. Advantageously, the structure is formed on a substrate using known techniques, thereby providing high quality material for light generation and extraction and when provided in this manner, a high quality structure is formed on a substrate which is subsequently removed in order to provide the structure that has improved light colour conversion efficiency, thereby reducing the processing burden required to provide the resultant structure.

Preferably the method further comprises depositing the colour conversion layer following removal of the substrate, wherein the light emitting structure is roughened following removal of the substrate and prior to forming the colour conversion layer. Advantageously, the same layer of the structure used for initiating high quality material growth is reused for colour conversion, enabling the formation of a structure without prohibiting colour conversion at a relatively similar position of the structure. Furthermore, roughening the substrates aids adhesion of the colour conversion layer and light extraction without compromising the effect of light emission from the structure.

Preferably the method further comprises bonding a handling device to the reflective layer. Advantageously, the structure is handled from the opposite side to the original growth substrate.

Preferably the light emitting structure comprises a GaN based structure. Advantageously, GaN based structures provide high efficiency emission suitable for colour conversion.

Preferably the light emitting layer comprises one or more epitaxial quantum wells. Advantageously, high quality epitaxial quantum well structures enable efficient light emission in epitaxial layered devices.

Preferably the light emitting layer is configured to emit light with a primary peak wavelength that corresponds to blue light. Advantageously, blue light has a shorter wavelength than red and green light and can be used to excite emission at a variety of wavelengths, including multicolour and white light emission.

Preferably the predetermined range of wavelengths comprises wavelengths of light shorter than 500 nm such that wavelengths over 500 nm are outside the predetermined range of wavelengths. Therefore, for example, when blue light is pumping red and green emission from the first layer of the colour conversion layer, the red and green emission is transmitted away from the structure and the light with a wavelength less than 500 nm is reflected back through the structure in order to be recycled. Therefore, increased output and efficiency from the colour conversion layer is enabled.

Preferably the layers of the colour conversion layer are separated by reflective sidewalls that extend through the light emitting layer, wherein the sidewalls comprise aluminium sidewalls coated in silicon dioxide. Advantageously this serves to split the light emitting device into electronically isolated, separately addressable elements, wherein optical cross-talk between the elements is reduced whilst improving the efficiency of each element by internally reflecting light that would otherwise be directed away from the light emitting surface, Further aspects of the invention will be apparent from the description and the appended claims.

DETAILED DESCRIPTION

A detailed description of embodiments of the invention is described, by way of example only, with reference to the figures, in which.

Figure 5:
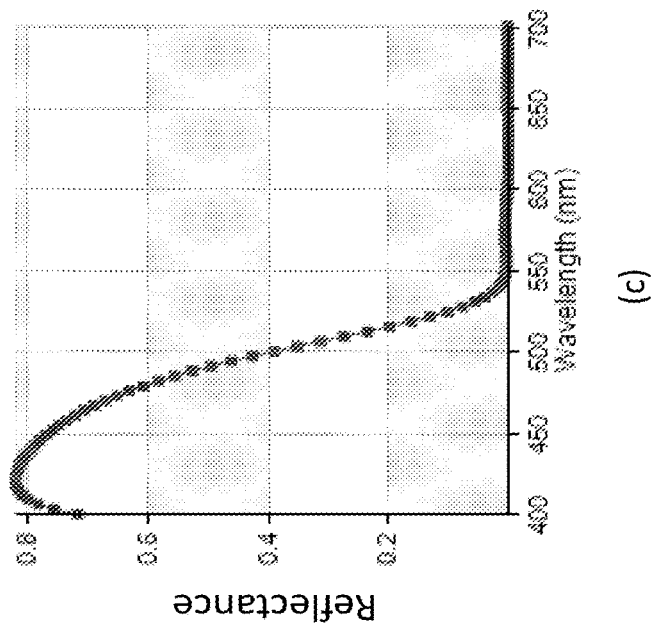
Figure 5:
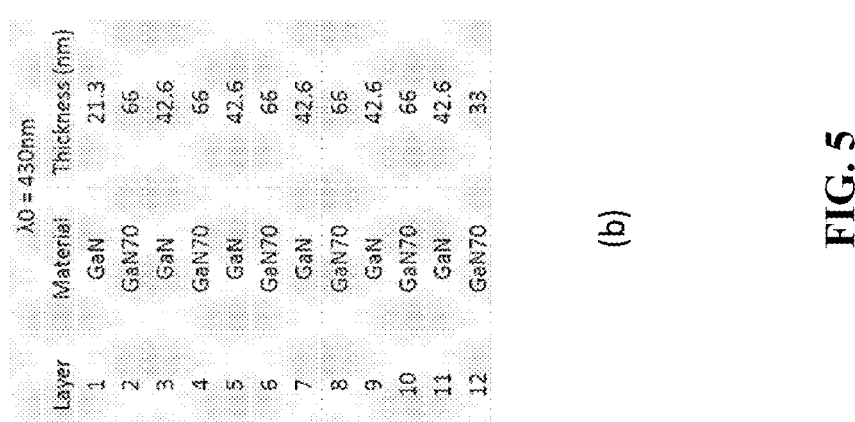
Figure 5:
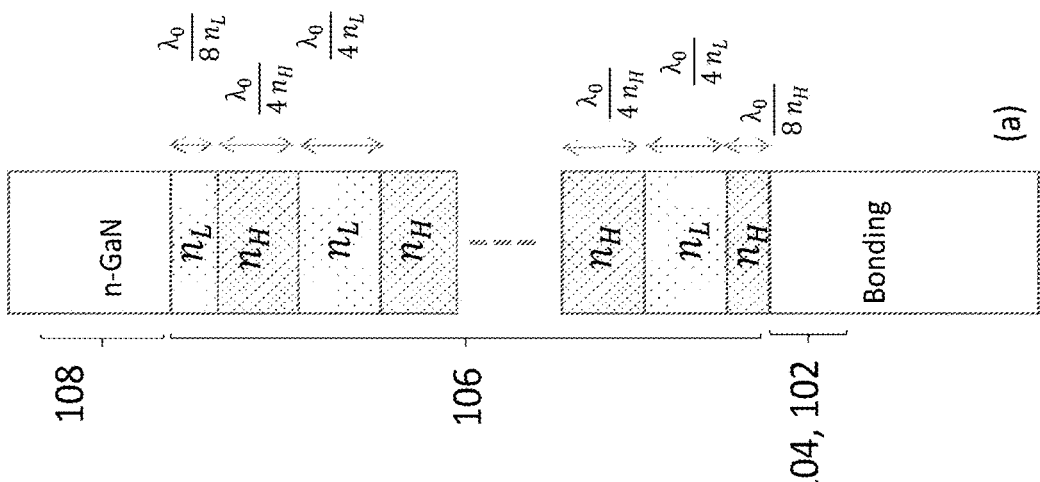

FIGS. 5(a) and 5(b) show an exemplary DBR structure;

FIG. 5(c) shows an exemplary reflectance profile at normal incidence for the DBR of FIG. 5(a).

The elegant and advantageous implementation of reflecting and partially reflecting layers in light emitting structures with colour conversion layers provides LED devices, such as micro-LED devices capable of realising white LED or multi-colour LED displays suitable for both mass transfer processes of individual micro-LEDs and for monolithic LED arrays. The synergistic combination of different layers in light emitting structures results in a solution for improved light conversion and extraction compared with known structures. Beneficially, implementations enable the improved functionality whilst maintaining the structural crystalline integrity of epitaxial compound semiconductor light emitting structures and also whilst reducing processing requirements.

The present invention uses distributed Bragg reflectors (DBR) to improve the performance of light emitting devices such as RGB LED and micro-LED devices. Methods of making DBR with GaN material are disclosed in Zhang et al. ACS Photonics, 2, 980 (2015), and more recently by Tongtong et al. "Wafer-scale Fabrication of Non-Polar Mesoporous GaN Distributed Bragg Reflectors via Electrochemical Porosification", Scientific Reports 7, article number 45344, 2017.

Figure 1:
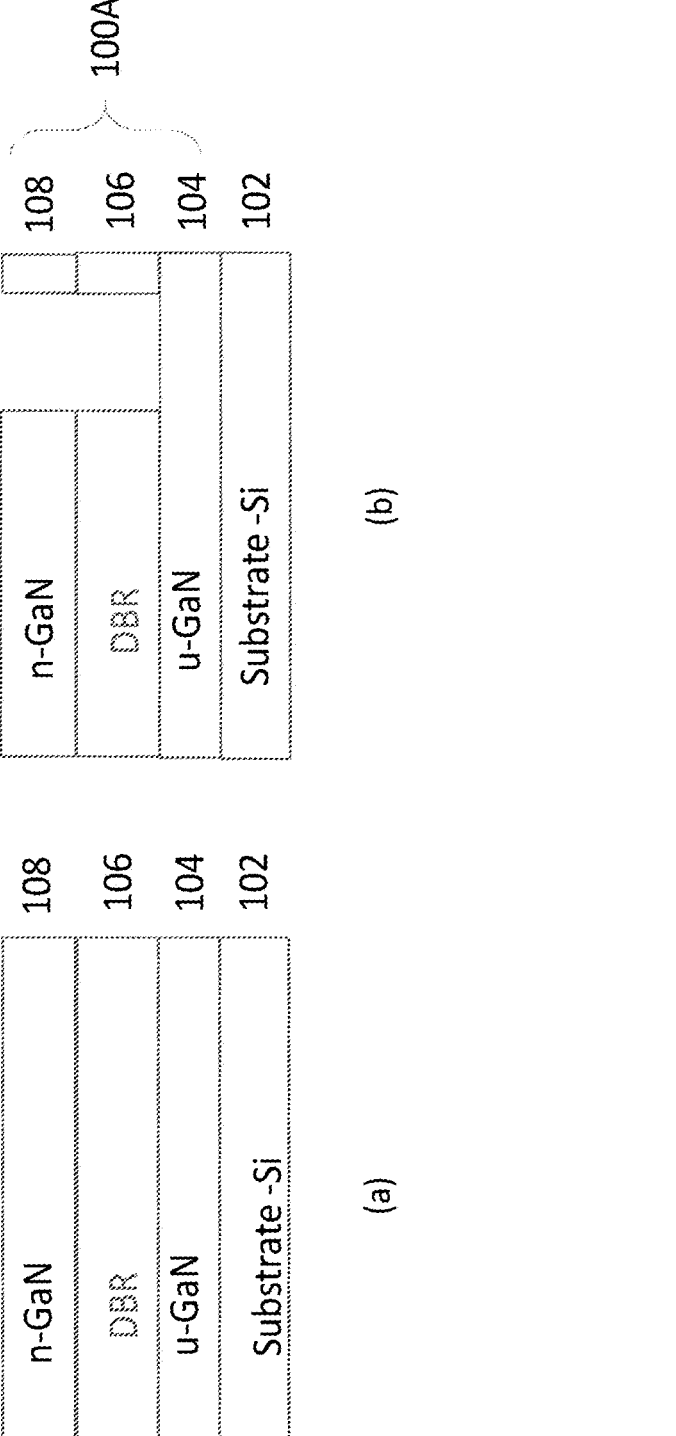
FIG. 1 shows a cross sectional view of a portion of the light emitting structure comprising a DBR.
Figure 2:
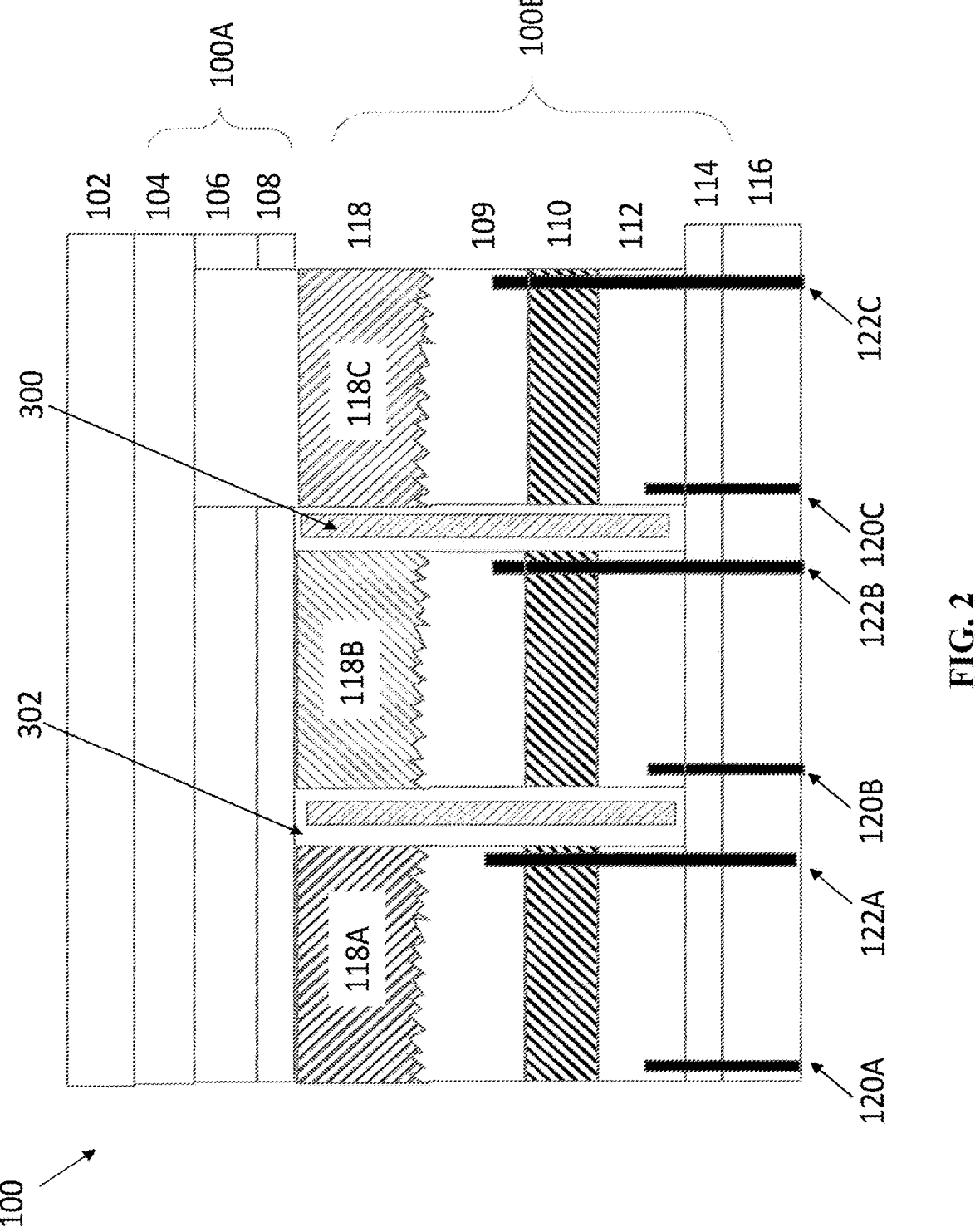
FIG. 2 shows a cross sectional view of a light emitting structure
Figure 3:
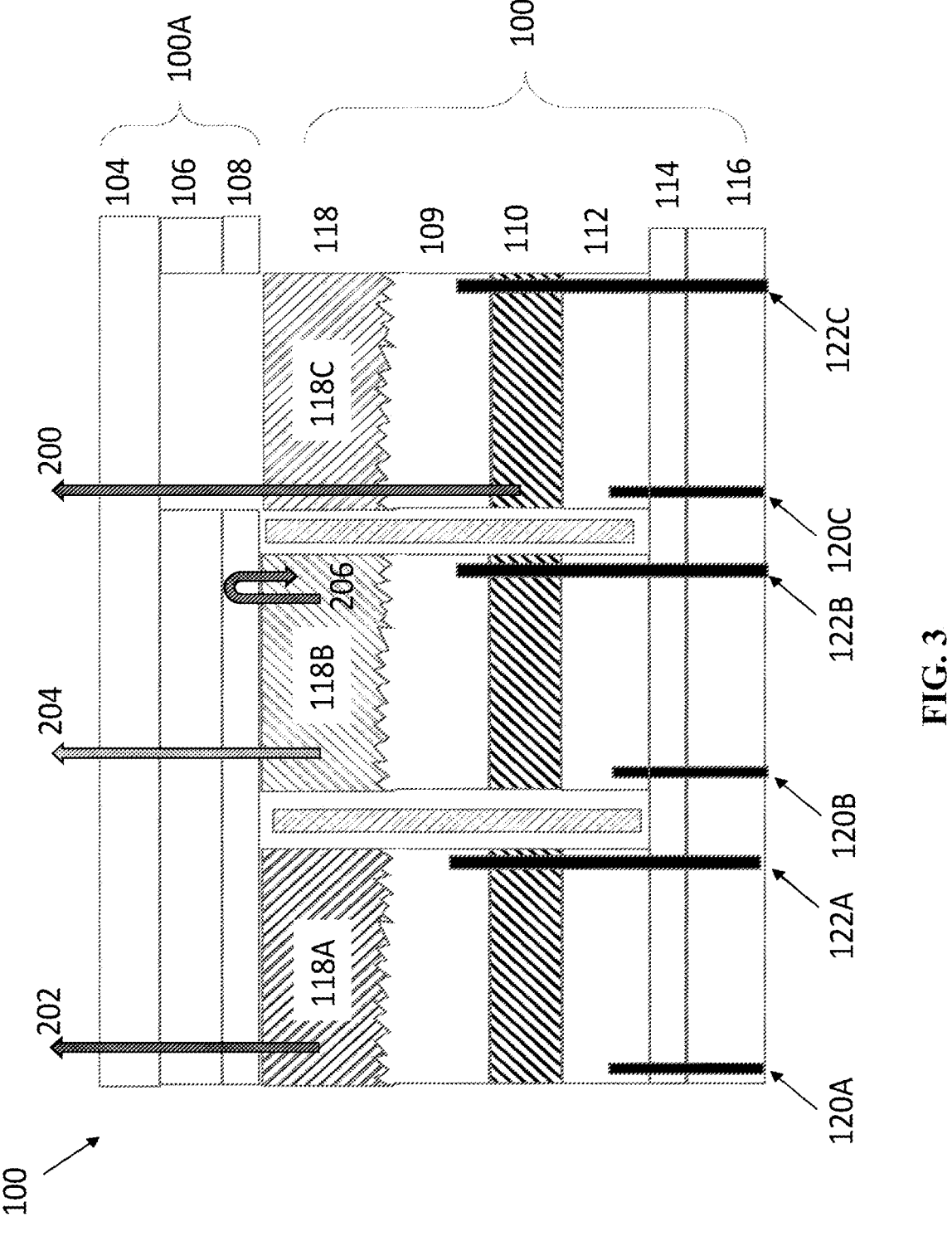
FIG. 3 shows a further processed version of the cross sectional view of the light emitting structure of FIG. 2.

A method of forming a light emitting structure 100 is described with reference to FIGS. 1-3. The light emitting structure 100 is an LED structure that uses colour conversion layer to provide light with desired wavelengths. The resultant light emitting structure is an LED structure that has a pump source LED and colour conversion layer. The method is described by virtue of cross sectional views through the layers of the light emitting structure 100 at different stages in the process of providing a light emitting structure with improved colour conversion. The layers shown in FIGS. 1-3 provide layers of light emitting structures with different functional properties. The layers of the light emitting structures with different functional properties are formed from one or more layers of different materials that work together to provide the functional properties (for example, light emitting layers may comprise multiple quantum well structures and partially reflective layers may comprise multiple layers of different refractive indices). In further examples, additional or alternative layers are used to facilitate the concepts described herein.

FIGS. 1(a) and (b) depict steps in the provision of a DBR filter 100A. There is shown a stack of epitaxial compound semiconductor crystalline layers. The epitaxial compound semiconductor crystalline layers are provided by sequential growth of the layers on a growth substrate 102. Beneficially, such epitaxial compound semiconductor crystalline layers formed in this manner can be controlled with high precision to provide high quality material.

There is shown a growth substrate 102 upon which there is grown a layer of undoped material 104 that is a buffer layer, or buffer layer. The undoped material 104 is a layer of undoped Gallium Nitride (u-GaN). Advantageously, the undoped material provides a layer that is transparent to at least visible and ultraviolet light.

On top of the undoped material 104 there is shown a layer that is a partially reflective layer 106. The growth substrate 102 is a growth silicon substrate. The partially reflective layer 106 is a distributed Bragg reflector (DBR). In an example the DBR is formed on an n-type semiconductor layer using the method described in Zhang et al., ACS Photonics, 2, 980 (2015). The partially reflective layer 106 is formed in a way that it reflects all wavelengths below 500 nm. Light of longer wavelengths, e.g., green light with a wavelength of 520 nm, is transmitted whereas the unconverted blue pump light is reflected by the partially reflective layer 106 and red light with a wavelength of 620 nm, is transmitted whereas the unconverted blue pump light is reflected by the partially reflective layer 106.

The partially reflective layer 106 is formed from alternating epitaxial crystalline layers of different refractive indices. The refractive indices of the layers, and the thicknesses of the layers, are selected in order to provide a reflectivity response as a function of the wavelength of light incident at the partially reflective layer 106. Further, the porosity of the epitaxial crystalline layers forming the partially reflective layer 106 is controlled in order to provide the desired reflectivity response as a function of wavelength, since the porosity of the epitaxial crystalline layers is linked to their refractive index.

In an example, alternating high and low refractive index layers form the partially reflective layer 106, whereby the thickness of each of the high ($n_H$) and low ($n_L$) refractive index layers is chosen so that the product of the thickness and the reciprocal index of refraction of the layer is $\lambda_0/4$, whereby $\lambda_0$ is the central wavelength of a high reflectivity response between $+/-\lambda_e$ around $\lambda_0$ in accordance with the following equation:

$$\lambda_e = \lambda_0/[1 - \left(\frac{2}{\pi}\right)\sin^{-1}\left(\frac{n_H - n_L}{n_H + n_L}\right)]$$

FIG. 5(a) illustrates a cross sectional view of an example of such alternating high and low refractive index layers forming a partially reflective layer 106, whilst FIG. 5(c) shows the associated reflectivity response as a function of wavelength. Alternating high and low refractive index layers start and terminate at the bottom and top of the structure with low refractive index layers that are half the thickness of the other low refractive index layers ($\lambda_0/8$ instead of $\lambda_0/4$) in the other alternating layers in the structure, providing the reflectivity response at normal incidence seen at FIG. 5(c).

Whilst the specific structure arranged to provide the desired effect can be implemented in different ways, in an example, the partially reflective layer 106 has a structure as described with respect to FIG. 5(b). The partially reflective layer 106 comprises alternating high and low refractive index layers. Where the structure is formed for a wavelength of light of $\lambda_0$=430 nm, a first layer has a thickness of 21.3 nm and is formed from non-porous Gallium Nitride. The next layer is a Gallium Nitride layer with a porosity of 70% and thickness of 66 nm. The next layer is another Gallium Nitride Layer that is not porous and is 42.6 nm thick. Four more pairs of alternating Gallium Nitride 66 nm thick with a porosity of 70% and non-porous 42.6 nm thick Gallium Nitride are formed. A final layer of 70% porous Gallium Nitride of 33 nm terminates the structure. The structure described with respect to FIGS. 5(a) and 5(b) provides a reflectance at normal incidence as a function of wavelength as shown at the reflectivity response of FIG. 4.

Whilst the partially reflective layer 106 is formed in the above manner, alternatively, or additionally the structure and/or layers of the partially reflective layer 106 are formed from different layers and materials, with different porosities and thicknesses that provide the required reflectivity response. For example, it is known that the porosity of a material can be changed in order to change its refractive index (e.g., see M. M. Braun, L. Pilon, "Effective optical properties of non-absorbing nanoporous thin films", This Solid Films 496 (2006) 505-514). For example, the refractive index for porous Gallium Nitride may vary as a function of the percentage porosity in accordance with the following equation:

$$n_p = \sqrt{(1 - p) \cdot n_{GaN}^2 + p}$$

where p is the percentage porosity and n is the refractive index. In an example, for a wavelength of 450 nm, the refractive index of porous Gallium Nitride is 2.44 at 0% porosity, 2.34 at 10% porosity, 2.23 at 20% porosity, 2.12 at 30% porosity, 2.00 at 40% porosity, 1.87 at 50% porosity, 1.73 at 60% porosity, 1.58 at 70% porosity, 1.41 at 80% porosity and 1.22 at 90% porosity. Therefore, advantageously, DBRs with the properties required to provide the reflectivity profiles herein are formable using alternating layer of GaN with different porosities, whilst maintaining the crystalline structure to form light emitting structures of high quality material. Alternatively, or additionally, the concept is applicable to different materials.

Whilst the partially reflective layer 106 is a distributed Bragg reflector (DBR), in further examples the partially reflective layer 106 is additionally, or alternatively, formed using different methods whilst maintaining the functionality of enabling reflection of some wavelengths of light and transmission of different wavelengths of light.

On top of the partially reflective layer 106 there is an n-type layer 108. The n-type layer 108 is n-doped Gallium Nitride (n-GaN).

Whilst the growth of epitaxial GaN-based materials on a silicon growth substrate 102 is shown, in further examples, additional or alternative intervening layers are used in order to account for a lattice mismatch between the silicon substrate 102 and the subsequently grown layers. In an example, the growth substrate 102 comprises silicon with an Aluminium Nitride (AlN) buffer layer. In further examples, the growth substrate 102 comprises an undoped GaN layer.

Once the structure of FIG. 1(a) has been provided, a selected portion of the partially reflective layer 106 and n-GaN layer 108 is removed. In an embodiment, this is achieved via a selective dry etch, though the skilled person would appreciate that any suitable alternative process could be applied. Advantageously, the anisotropic etching process provides a sharper distinction between the different colour light emitting regions of the light emitting structure 100 (as shown in FIG. 3) than would otherwise be achievable with conventional optical coatings, further boosting the performance of small scale devices.

As shown in FIG. 2, the DBR filter 100A is bonded to an underlying RGB LED device 100B. In an alternative embodiment, the DBR filter 100A and RGB LED device 100B are attached via mechanical means.

The RGB LED device 100B includes a light emitting layer 110 sandwiched between a n-type layer 109 and p-type layer 112. In a preferred embodiment, the light emitting layer 110 is a blue light emitting layer 110. In an embodiment, these layers are epitaxial compound semiconductor crystalline layers provided by sequential growth of the layers on a growth substrate (not shown) that is subsequently removed. Beneficially, such epitaxial compound semiconductor crystalline layers formed in this manner can be controlled with high precision to provide high quality material and efficient light emission upon the injection of carriers, from n-type and p-type layers, into a light emitting layer. In an embodiment the n-type layer 109 is n-doped GaN (n-GaN) and the p-type layer is p-doped Gallium Nitride (p-GaN), though any suitable materials may be used. The illustrated RGB LED 100B is based on a typical blue LED structure. In further examples, alternative blue light emitting structures are used, with additional or alternative layers.

The RGB LED device 100B further includes a colour conversion layer 118 formed on the n-type layer 109. In an embodiment, the colour conversion layer 118 is formed on the surface of the n-type layer 109 exposed following removal of the substrate on which the n-type layer 109, light emitting layer 110 and p-type layer were grown. In a further embodiment, the surface of the n-type layer is roughened prior to the deposition of the colour conversion layer 118 so as to improve adhesion of the colour conversion layer 118.

The colour conversion layer 118 is formed of three regions 118A-C spaced laterally along the plane of the layer 118, where region 118A and 118B are configured to generate light of different wavelengths using light emitted by the light emitting layer 110. In a preferred embodiment, regions 118A and 118B generate red and green light respectively using incident blue light generated by the light emitting layer 110. In an embodiment, regions 118A and 118B are phosphors. Alternatively, or additionally, regions 118A and 118B comprise any suitable means to convert wavelengths of light from a pump source LED, for example using quantum dots (QDs) or organic semiconductors or other quantum confining structures, such as quantum wells. Region 118C is configured to allow blue light from the light emitting layer to pass through. In an embodiment, region 118C is provided by a colourless transparent material, such as a resin or transparent oxide, though any suitable material can be used.

In the illustrated embodiment, each region 118A-C of the colour conversion layer 118 along with the underlying portion of the light emitting layer 110 is surrounded by reflective sidewalls. In a preferred embodiment, the reflective sidewalls are formed by aluminium sidewalls 300 coated in an insulating material such as silicon dioxide 302. As is shown in FIGS. 2 and 3, the sidewalls 300 extend through colour conversion layer 118, the n-type layer 109, the light emitting layer 110 and the p-type layer. These sidewalls are formed via conventional means and serve to partition the RGB LED 100B into three electrically isolated (and thus separately addressable) elements whilst reducing optical crosstalk between each element of the RGB LED device 100B. In a preferred embodiment, the elements correspond to the portions of the RGB LED 100B that generate red, green and blue light.

The RGB LED device 100B further includes a mirror layer 114 formed of a highly reflective Ag (silver) based mirror deposited on the p-type layer 112 and arranged to intercept light emitted by the light emitting layer into the p-type layer 112. The mirror layer 114 has been processed in a way that allows it to form a eutectic bond with a handling device 116. The handling device 116 is a silicon wafer and in an example is beneficially used for its physical properties, such as thermal and structural properties. In further examples additional and/or alternative materials are used to form the handling device 116. In further examples, additional and/or alternative materials are used to form the reflective mirror layer 114, for example, the reflective mirror layer 114 may use a different method to enable bonding to the handling device 116, e.g., using a separate bonding layer and reflective layer. In further examples, the reflective mirror layer 114 is a mirror formed from other materials. The reflective mirror layer 114 is arranged to reflect at least visible and/or ultraviolet wavelengths of light, including the primary peak wavelength of light emitted by the light emitting layer 110. Beneficially, light emitted by the light emitting layer 110 that is backscattered towards the reflective mirror layer 114, and light that is recycled into the light emitting structure through the partially reflective layer 106, is reflected back towards the colour conversion layer 118, thereby to enhance colour conversion and light output from the light emitting structure.

Also shown are through silicon vias (TSV) 120A-C and 122A-C extending from the handling device 116 into the light emitting structure 100. These allow for separate electrical contacts to be made to each isolated portion of the light emitting layer 110 so as to allow for colour-selective operation of the light emitting structure 100.

The DBR filter 100A and RGB LED device 100B are positioned such that region 118C of the RGB LED 100B is aligned with the selectively etched portion of the DBR filter 100A. Advantageously, this step of the process can be implemented across multiple devices 100 simultaneously when said devices are provided in an array. Though depicted as a single DBR filter 100A applied to a single underlying RGB LED device 100B, the DBR filter 100A can be provided as a continuous layer across an entire first wafer/handling device having regularly etched portions corresponding to regions 118C of an array of RGB LED devices on a second wafer/handling device. By aligning such a DBR filter 100A with an underlying array in a single, whole wafer step, the manufacturing process is greatly simplified and further benefits from the associated economies of scale. Additionally, the growth substrate 102 provides a uniform outer layer by which the DBR filter can be securely and controllably handled so as to allow for accurate positioning of the filter relative to the regions of the RGB LED devices.

The light emitting structure 100 is processed in order to remove the growth substrate 102 of the DBR filter 100A. Again, in embodiments wherein the RGB LED devices are provided as an array, this single step can be performed for each device in the array simultaneously. The resulting structure is shown at FIG. 3. FIG. 3 shows a cross sectional view of the light emitting structure 100. The growth substrate 102, which is a silicon growth wafer, is removed by wet etching with KOH solution, hydrofluoric acid and nitric acid, BOE, or similar wet etching solutions. Where a buffer layer has been formed on the growth substrate 102 prior to growth of the subsequent light emitting structure, the buffer layer is optionally removed by dry etching. Where the RGB LED devices are provided in an array of repeated structures across a wafer, this etch step can be performed for every device of the array at once.

Advantageously, the illustrated structure enables increased light output and efficiency from the colour-converted light. Beneficially, the elegant arrangement of the structure results in an efficient process flow that is suitable for mass manufacturing, as the growth of high quality light emitting structures is provided and light conversion is improved. Beneficially, the increase in light conversion efficiency means that less colour conversion layer is used. This is advantageous in respect of cost and processing and means that thinner, more efficient layer of colour conversion layer 118 are used.

The light emitting structure 100 is formed using epitaxial compound semiconductor growth techniques such as metalorganic chemical vapour deposition (MOCVD) and molecular beam epitaxy (MBE). Additionally, or alternatively, the light emitting structure 100 is formed using any appropriate technique. Whilst the light emitting structures 100 is an LED structure, in further examples, additionally, or alternatively, the light emitting structure 100 is a different light emitting structure benefitting from the use of a partially reflective layer selectively to control wavelengths of light passing through the whole light emitting structure.

The growth of the epitaxial crystalline compound semiconductor layers described above is performed using growth/deposition on silicon wafers that are used as a growth substrate. Alternatively, or additionally, other wafers are used, such as sapphire wafers or freestanding Gallium Nitride (GaN) wafers, for example.

Whilst certain epitaxial crystalline compound semiconductor layers are shown in FIGS. 1-3, the skilled person understands that alternative, or additional, layers are used in further examples. Further, in some examples, some of the epitaxial crystalline compound semiconductor layers are removed whilst maintaining the essence of the concepts described herein.

The light emitting structures described with respect to FIGS. 1-5 are formed from Nitride-based materials. In particular, the epitaxial crystalline compound semiconductor layers are Gallium Nitride (GaN) based materials. Whilst the structures described in relation to FIGS. 1 to 5 relate to Nitride-based semiconductor compound materials, the skilled person understands that the concepts described herein are applicable to other materials, in particular to other semiconductor materials, for example other III-V compound semiconductor materials, or II-VI compound semiconductor materials.

The light emitting layer 110 is formed to include multiple quantum wells (MQWs). The blue light emitting layer 110 includes MQWs that are configured to emit light with a primary peak wavelength that is blue, when carriers radiatively combine in the MQWs. The MQWs are formed from Indium Gallium Nitride (InGaN) that is epitaxially grown between GaN-based layers with the composition of the individual quantum wells being tailored to provide the desired wavelength of light that can be emitted from them.

Whilst MQWs are described in the light emitting layer 110, alternatively a single quantum well (SQW) layer is used. In further examples the light emitting layer 110 comprises quantum dots (QDs) that are configured to emit light when carriers radiatively combine in the QDs. Whilst the primary peak wavelength of light emitted from the light emitting layer 110 described with reference to FIGS. 1-3 is configured to be blue, in further examples, the light emitting layer 110 is additionally, or alternatively, configured to emit light with a different primary peak wavelength, for example ultraviolet light.

Further, the skilled person understands that the provision of the light emitting structure in the manner described results in the efficient and high quality generation of material with reduced processing steps, by incorporating layers in the structure, either in the process of forming the individual light emitting structures, or in the processing steps involved in bringing those individual light emitting structures together and processing the resultant structure. However, the skilled person further understands that in further examples, additional or alternative steps are used to form the structure and the order of the steps is chosen to provide different or additional benefits.

FIG. 3 further illustrates the light emission concept from the light emitting structure 100. The light emitting structure 100 is arranged such that carriers are injected into the light emitting layer 110, thereby resulting in radiative recombination and the emission of light with a primary peak wavelength that is blue (approximately 450 nm). Carrier injection occurs as a result of providing electrical contact to the n-type layer and to the p-type layer. Such electrical contact is provided by the formation of an anode and a cathode (not shown) using vias 120A-C and 122A-C.

Upon excitation of the active, light emitting layer 110, light with a primary peak wavelength of 450 nm (blue light) is emitted. The emission of light from the light emitting layer 110 is non-uniform, with higher intensity in the directions perpendicular to the lateral planes formed by the quantum well(s) in the light emitting layer 110. As demonstrated by the arrows at FIG. 3, blue light emitted by the light emitting layer 110 passes through the n-type layer 109 and is incident on the colour conversion layer. Light incident on region 118C of the colour conversion layer is transmitted through the colour conversion layer 118 and passes through the portion of the DBR filter 100A corresponding to the gap in the partially reflective layer 106 to exit the light emitting structure 100 as blue light, providing light emission from a defined top surface. This is illustrated by arrow 200.

Light incident on regions 118A or 118B excites carriers having a wavelength corresponding to either red or green light respectively. Back-scattered blue light emitted by the light emitting layer 110 that passes through the p-type layer 112 is reflected by the reflective layer mirror 114 and passes through the rest of the light emitting structure 100 in order to excite carriers in the colour conversion layer 118.

In contrast, light generated and/or transmitted by the colour conversion layer 118 and incident on the partially reflective layer 106 (for example, when not passing out through other surfaces) is either reflected by the partially reflective layer 106, or is transmitted through the partially reflective layer 106 depending on its wavelength. Where blue light from the light emitting layer 110 generates red light from region 118A of the colour conversion layer 118, the red light that is incident on the partially reflective layer 106 is transmitted by the partially reflective layer 106 and exits the structure, providing light emission from a defined top surface. This is illustrated by an arrow 202. Where blue light from the light emitting layer 110 generates green light from region 118B of the colour conversion layer 118, the green light that is incident on the partially reflective layer 106 is transmitted by the partially reflective layer 106 and exits the structure providing light emission from the defined top surface. This is illustrated by an arrow 204. Where blue light from the light emitting layer 110 results in blue light from regions 118A or 118B of the colour conversion layer 118 being emitted (including generated or transmitted), the blue light that is incident on the partially reflective layer 106 is reflected by the partially reflective layer 106 and passes through the structure, whereby any light incident on the bottom mirror layer 114 is reflected, such that it may be provided with the opportunity to excite emission in the colour conversion layer. This is shown by an arrow 206. Beneficially, light from the colour conversion layer 118 is directed away from the light emitting structure 100 through the same defined top surface, whilst light that is directed downwards (away from the top surface and back into the light emitting structure from where light is generated by the pump source LED) is re-used to generate further emission away from the light emitting structure through the defined top surface.

Whilst the colour conversion layer is described with reference to the production of red, green and blue light, alternatively or additionally the light generated in the colour conversion layer 118 has a broad spectrum, such as white light. In such a case, the partially reflective layer 106 provides selective transmission and reflection of light based on the wavelength of light incident at the partially reflective layer 106, such that the partially reflective layer is configured to reflect a predetermined range of wavelengths. The predetermined range of wavelengths comprises wavelengths less than 500 nm.

In an alternative embodiment, shorter wavelength light sources (e.g., UV light sources, for example at approximately 380 nm) are used to pump colour conversion layer in a manner that benefits from a partially reflective layer 106 and mirror layer 114 that increases the efficiency of conversion of light and extraction of light from a light emitting structure, for example where the partially reflective layer 106 transmits blue light as well as red and green light. Therefore, in examples, beneficial predetermined ranges of wavelengths of light reflected by the partially reflective layer 106 include all wavelengths below 380 nm, whilst any higher wavelengths are transmitted through the partially reflective layer 106.

Whilst the partially reflective layer 106 is configured to reflect light in a predetermined range of wavelengths, in some examples less than 100% of the light incident at the partially reflective layer 106 is reflected in the predetermined range of wavelengths (e.g., due to absorption/minor transmission) and the partially reflective layer 106 is optimised to reflect light as efficiently as possible in the predetermined range of wavelengths to provide an effect of selective transmission of light from light emitting structure 100 such that pump source wavelengths of light from the colour conversion layer are recycled in the light emitting structure, hitting the reflective layer, before exiting to the colour conversion layer once again.

Advantageously, light that does not contribute to the emission from the colour conversion layer 118 in the side of the structure opposite to the light emitting layer 110 is provided with a further opportunity to be emitted from the structure, by reflectance by the bottom mirror layer 114. Beneficially, the amount of light emitted by a colour conversion LED with such a structure is increased and the efficiency of conversion of light is also increased by the use of the partially reflective layer 106 in combination with the reflective layer mirror layer 114.

For micro LED display applications, the size of the emitting area of each individual colour is preferably smaller than 5 microns, therefore the thickness of the colour conversion layer 118 is preferably thinner than 5 microns in order to reduce light absorption losses due to multi reflections from the aluminium sidewalls 300. Most preferably, the aspect ratio of the thickness of layer 118 to the size of the emitting area of an individual micro LED is smaller than 1:1. For instance, a micro LED display with 3 micron sub-pixel size (individual colours) would preferably have a colour conversion layer 118 thinner than 3 microns.

The provision of a DBR filter 100A allows for the thickness of layer 118 to be reduced without negatively impacting on the performance of the device 100. This in turn reduces light absorption from the sidewalls 300, further boosting performance.

Figure 4:
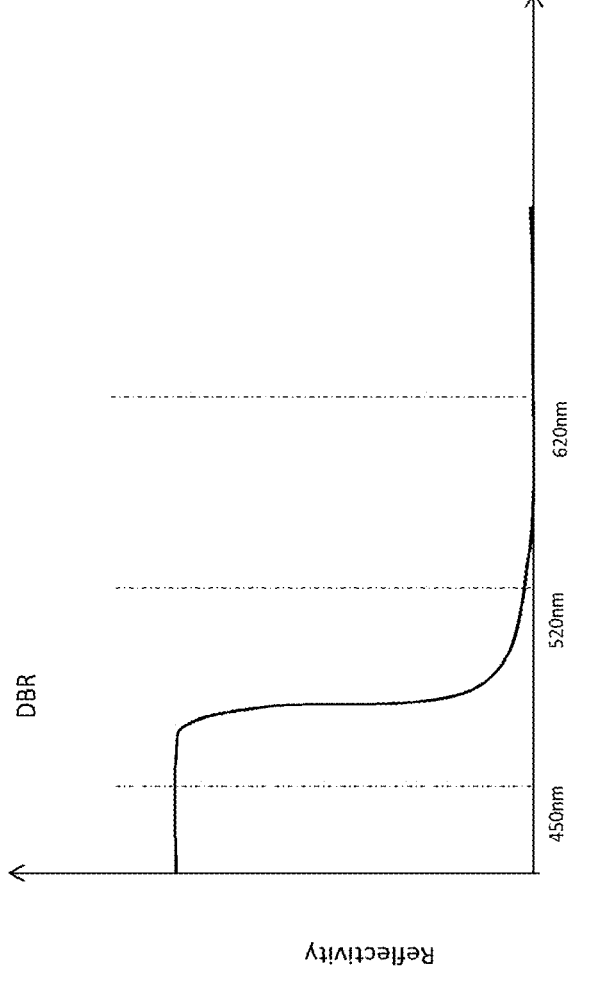
FIG. 4 shows a light emission and reflectivity profile of a DBR

FIG. 4 shows a reflectivity profile of the partially reflective layer 106 described with reference to the structure of FIG. 3. The reflectivity profile is such that light with a wavelength below 500 nm is substantially reflected by the partially reflective layer 106, whilst light with a wavelength above 500 nm is substantially transmitted by the partially reflective layer 106. A partially reflective layer 106 with such properties can be implemented using different methods and structures. An example of such a structure providing functionality that may be used in such a fashion is described above and with reference to FIGS. 1-5.

Whilst the above structures are described with reference to the emission of blue light from the light emitting layer, the skilled person understands that these concepts are applicable to light with different primary peak wavelengths emitted by the light emitting layer, such that the overall amount of colour-converted light that is emitted from the colour conversion layer 118 is improved.

What is claimed is:

1. A method of forming a light emitting structure comprising:

providing a partially reflective layer and a reflective layer;

forming a light emitting layer at least partially between the partially reflective layer and the reflective layer;

providing a colour conversion layer at least partially between the light emitting layer and the partially reflective layer;

wherein the light emitting layer is configured to emit light having a primary peak wavelength $\lambda_0$, wherein the partially reflective layer is configured to reflect light within a predetermined range of wavelengths and transmit light outside the predetermined range of wavelengths and wherein the primary peak wavelength, $\lambda_0$, is within the predetermined range of wavelengths, wherein the partially reflective layer is a Distributed Bragg Reflector comprising a first sublayer a having refractive index $n_H$ and a thickness, $\lambda_0/8n_H$ and a second sublayer having a refractive index $n_L$ and a thickness $\lambda_0/8n_L$, where $n_H$ is greater than $n_L$, and wherein the first and second sublayer are separated by a third sublayer having a refractive index $n_H$ and a thickness $\lambda_0/4n_H$ and a fourth sublayer having a refractive index $n_L$ and a thickness $\lambda_0/4n_L$.

2. The method of claim 1 wherein the colour conversion layer comprises first and second laterally spaced layers wherein the first layer is configured to covert incident light having the primary peak wavelength into light having a wavelength outside the predetermined range of wavelengths and the second layer is configured to transmit incident light having the primary peak wavelength, and wherein the partially reflective layer extends over the first layer of the colour conversion layer, but not the second layer.

3. The method of claim 2 wherein the first layer of the colour conversion layer further comprises first and second laterally spaced sub-layers, wherein the first sub-layer is configured to convert incident light having the primary peak wavelength in to light having a first wavelength outside the predetermined range of wavelengths and the second sub-layer is configured to convert incident light having the primary peak wavelength in to light having a second wavelength outside the predetermined range of wavelengths.

4. The method of claim 2 wherein the layers of the colour conversion layer are separated by reflective sidewalls that extend through the light emitting layer, wherein the sidewalls comprise aluminium sidewalls coated in silicon dioxide.

5. The method of claim 1 wherein the partially reflective layer comprises porous GaN and wherein the reflective layer comprises a Ag-based mirror.

6. The method according to claim 1, comprising depositing the reflective layer on a light emitting device comprising the light emitting layer.

7. The method according to claim 1 comprising growing a light emitting device comprising the light emitting layer on a substrate, followed by removing the substrate by wet etching.

8. The method according to claim 7, comprising depositing the colour conversion layer following removal of the substrate, wherein the light emitting structure is roughened following removal of the substrate and prior to forming the colour conversion layer.

9. The method according to claim 1, comprising bonding a handling device to the reflective layer.

10. The method of claim 1 wherein the light emitting structure comprises a GaN based structure and wherein the light emitting layer comprises one or more epitaxial quantum wells.

11. The method of claim 1 wherein the light emitting layer is configured to emit light with a primary peak wavelength that corresponds to blue light.

12. The method of claim 1 wherein the predetermined range of wavelengths comprises wavelengths of light shorter than 500 nm such that wavelengths over 500 nm are outside the predetermined range of wavelengths.

13. A light emitting structure comprising:

a light emitting layer configured to emit light having a primary peak wavelength 2;

a partially reflective layer;

a reflective layer; and a colour conversion layer, wherein the light emitting layer is positioned at least partially between the partially reflective layer and the reflective layer and the colour conversion layer is positioned at least partially between the light emitting layer and the partially reflective layer, wherein the partially reflective layer is configured to reflect light within a predetermined range of wavelengths and transmit light outside the predetermined range of wavelengths and wherein the primary peak wavelength is within the predetermined range of wavelengths wherein the partially reflective layer is a Distributed Bragg Reflector comprising a first sublayer having refractive index $n_H$ and thickness $\lambda_0/8n_H$ and a second sublayer having refractive index $n_L$ and thickness $\lambda_0/8n_L$, where $n_H$ is greater than $n_L$, wherein the first and second sublayer are separated by a third sublayer having refractive index $n_H$ and thickness $\lambda_0/4n_H$ and a fourth sublayer having refractive index $n_L$ and thickness $\lambda_0 4n_L$.

14. The light emitting structure of claim 13 wherein the colour conversion layer comprises first and second laterally spaced layers wherein the first layer is configured to covert incident light having the primary peak wavelength into light having a wavelength outside the predetermined range of wavelengths and the second layer is configured to transmit incident light having the primary peak wavelength, and wherein the partially reflective layer extends over the first layer of the colour conversion layer, but not the second layer.

15. The light emitting structure of claim 14 wherein the first layer of the colour conversion layer further comprises first and second laterally spaced sub-layers, wherein the first sub-layer is configured to convert incident light having the primary peak wavelength in to light having a first wavelength outside the predetermined range of wavelengths and the second sub-layer is configured to convert incident light having the primary peak wavelength in to light having a second wavelength outside the predetermined range of wavelengths.

16. The light emitting structure of claim 14 wherein the partially reflective layer comprises porous GaN and wherein the reflective layer comprises a Ag-based mirror.

17. The light emitting structure of claim 14 wherein the light emitting structure comprises a GaN based structure, and wherein the light emitting layer comprises one or more epitaxial quantum wells.

18. The light emitting structure of claim 14 wherein the light emitting layer is configured to emit light with a primary peak wavelength that corresponds to blue light.

19. The light emitting structure of claim 14 wherein the predetermined range of wavelengths comprises wavelengths of light shorter than 500 nm such that wavelengths over 500 nm are outside the predetermined range of wavelengths.

20. The light emitting structure of claim 14 wherein the layers of the colour conversion layer are separated by reflective sidewalls that extend through the light emitting layer, wherein the sidewalls comprise aluminium sidewalls coated in silicon dioxide.

* * * * *